(12) United States Patent
Oikawa

(10) Patent No.: US 6,548,884 B2
(45) Date of Patent: Apr. 15, 2003

(54) SEMICONDUCTOR DEVICE

(75) Inventor: Takeshi Oikawa, Tokyo (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 58 days.

(21) Appl. No.: 09/850,274

(22) Filed: May 7, 2001

(65) Prior Publication Data

US 2001/0052633 A1 Dec. 20, 2001

(30) Foreign Application Priority Data

May 10, 2000 (JP) ........................ 2000/136622

(51) Int. Cl.[7] .............................................. H01L 29/00
(52) U.S. Cl. .................. 257/529; 257/202; 257/209; 257/528; 438/132; 438/215; 438/281
(58) Field of Search .................. 257/529, 209, 257/258, 202; 438/132, 215, 281, 333, 467, 601

(56) References Cited

U.S. PATENT DOCUMENTS 4,532,607 A * 7/1985 Uchida ........................ 365/96
4,546,455 A * 10/1985 Iwahashi et al. ............ 365/200
5,140,554 A * 8/1992 Schreck et al. ............. 365/201
6,263,295 B1 * 7/2001 Morgan ....................... 702/117

FOREIGN PATENT DOCUMENTS

JP 59126651 A * 7/1984
JP 10-62477 3/1998

* cited by examiner

Primary Examiner—Nathan J. Flynn
Assistant Examiner—Remmon R. Fordé
(74) Attorney, Agent, or Firm—Darryl G. Walker; Bradley T. Sako (57) ABSTRACT

A semiconductor device having a fuse evaluation circuit is provided. Fuse evaluation circuit (100) can include, a reference voltage generation circuit (110), a fuse circuit (120-n), and a fuse evaluation control circuit (130). Fuse circuit (120-n) can include a fuse (Fn) and evaluation transistor (Tn) arranged in-series and providing an evaluation node (Nn) at their connection. Reference voltage generation circuit (110) can provide a reference voltage (VG1) at a control gate of evaluation transistor (Tn). Fuse evaluation control circuit (130) can vary the impedance of the evaluation transistor (Tn) by varying the potential of reference voltage (VG1). Fuse evaluation circuit (100) can evaluate the condition of fuse (Fn) accordingly.

20 Claims, 6 Drawing Sheets

SEMICONDUCTOR DEVICE

TECHNICAL FIELD

The present invention relates generally to semiconductor devices and more particularly to a semiconductor device having fuse state determination circuitry.

BACKGROUND OF THE INVENTION

Semiconductor devices can use fuse structures than are programmable during the manufacturing process. One such application for a fuse structure is in a semiconductor memory device. In a semiconductor memory device, tight processing margins can cause defects to arise in a memory array. The semiconductor memory will be tested for defects and when there are defects, redundant memory cells can be used to replace defective bits of the memory array. The redundancy will typically be in the form of a redundant row or a redundant column of memory cells.

In order to program the redundant row or column to respond to the address value of a defective bit or bits, fuse structures will be programmed with the address value corresponding to the defective bit. In this case a fuse corresponding to one address bit will be left intact to create a short fuse condition for one address value and will be broken (blown) to create an open fuse condition for another address value. In this manner a redundant decoder can be programmed to respond to the address value corresponding to the defective memory cell or cells.

Figure 7:
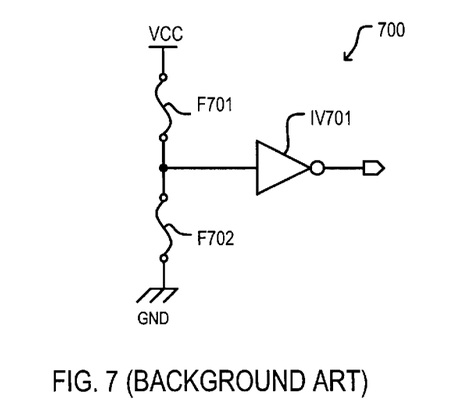
FIG. 7 is a circuit schematic diagram of a conventional fuse circuit.

Referring now to FIG. 7, a circuit diagram of a conventional fuse circuit is set forth and given the general reference character 700. Conventional fuse circuit 700 has two fuses (F701 and F702) connected in series between a power supply voltage VCC and ground. Fuse F701 and fuse F702 are connected at a connecting point. Conventional fuse circuit 700 also has an inverter IV701 having an input connected to the connecting point of fuses (F701 and F702) and an output generating a logic value corresponding to the programmed configuration of fuses (F701 and F702).

When fuse F701 is broken, the input of inverter IV701 becomes a logic low thus generating a logic high output. When fuse F702 is broken, the input of inverter IV701 becomes a logic high thus generating a logic low output.

Conventional fuse circuit 700 requires two fuses (F701 and F702) for one programmable bit. Each fuse (F701 and F702) requires significant circuit area due to the accuracy and destructiveness of the fuse breaking (blowing) procedure. Thus, conventional fuse circuit 700 consumes significant chip area, which increases manufacturing costs. Furthermore, there are typically many fuse circuits on a chip.

Also, conventional fuse circuit 700 consumes significant amounts of current before a fuse (F701 or F702) is broken. This is undesirable because the increased current consumption can cause the chip to operate differently in the test condition than it would in a normal operating condition. This can create testing integrity problems.

Another drawback with conventional fuse circuit 700 is that a fuse (F701 and F702) must be broken for each conventional fuse circuit 700 on the chip regardless as to whether there are any defects. Otherwise, operating current would be undesirably high.

In order to address some of the above-mentioned problems, other fuse circuit configurations have been developed.

Figure 8:
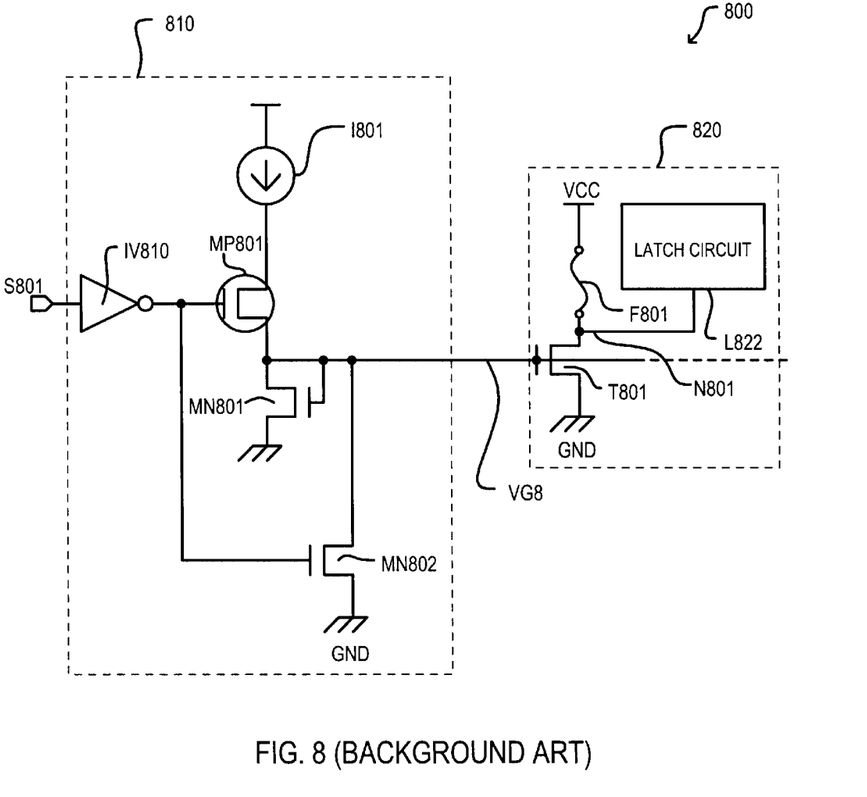
FIG. 8 is a circuit schematic diagram of a conventional fuse evaluation circuit including fuses.

Referring now to FIG. 8, a conventional fuse evaluation circuit including fuses is set forth in a schematic diagram and given the general reference character 800.

Conventional fuse evaluation circuit 800 has a reference voltage generation circuit 810 and a fuse circuit 820.

Fuse circuit 820 has a single fuse F801 and transistor T801. Fuse F801 is connected between a power supply VCC and a connecting node N801. Transistor T801 has a source/drain path connected between ground and connecting node N801. A control gate of transistor T801 receives a reference voltage VG8 from reference voltage generation circuit 810. Fuse circuit 820 also has a latch circuit L822 connected to connecting node N801.

Reference voltage generation circuit 810 has an inverter IV810 connected to receive a fuse evaluation signal S801 and has an output connected to control gates of p-channel transistor MP801 and n-channel transistor MN802. Reference voltage generation circuit 810 has a constant-current source 1801 connected between a power supply VCC and the source of p-channel transistor MP801. P-channel transistor has a drain connected to reference voltage VG8. Reference voltage generation circuit 810 also has a n-channel transistor MN801 having a drain and a gate connected to reference voltage VG8 and a source connected to ground. N-channel transistor MN802 has a drain connected to reference voltage VG8 and a source connected to ground.

Reference voltage generation circuit 810 receives a fuse evaluation signal S801 and generates a reference voltage VG8. Fuse circuit 820 receives the reference voltage and evaluates the condition of fuse F801.

When fuse evaluation signal S801 is logic low, the output of inverter IV810 becomes high, thus p-channel transistor MP801 is turned off and n-channel transistor MN802 is turned on. Thus, reference voltage generation circuit 810 provides a reference voltage VG8 that is at ground. This turns off transistor T801, which reduces the standby current consumption in fuse circuit 820.

When the status of fuse F801 is to be evaluated, evaluation signal S801 transitions from logic low to logic high. Inverter IV810 provides logic low to the control gates of p-channel transistor MP801 and n-channel transistor MN802. Thus, p-channel transistor MP801 is turned on and n-channel transistor MN802 is turned off. This allows constant current source 1801 to provide a current through p-channel transistor and n-channel transistor MN801 to ground. N-channel transistor MN801 is configured in a diode configuration to provide a reference voltage VG8 to the control gate of transistor T801 in fuse circuit 820. In this manner, transistor T801 is turned on and the level of reference voltage VG8 and size of transistor T801 is chosen so that transistor T801 provides an on-impedance path that has a resistance that is approximately two times larger than the intact resistance of fuse F801. Latch circuit L801 includes an inverter to receive the voltage at connecting node N801. The threshold of the inverter is VCC/2. Thus, if the potential of connecting node N801 is less than VCC/2, fuse F801 is evaluated as broken and a low logic level is latched in latch circuit L822. If the potential of connecting node N801 is greater than VCC/2, fuse F801 is evaluated as intact and a high logic level is latched in latch circuit L822. The potential of connecting node N801 is determined by the ratio of the on-resistance of transistor T801 and the resistance of intact or broken fuse F801.

However, a fuse such as fuse F801 is typically blown by a laser and is not always completely broken. A fuse F801 is sometimes only partially broken which can cause the fuse F801 to have a resistance in the range of several tens of kΩ. In a case in which conventional fuse evaluation circuit 800 is used, the resistance of a partially broken fuse can cause the potential of connecting node N801 to be very close to VCC/2 during the fuse evaluation. This can create cases where fuse F801 may be evaluated to be broken under a certain operating condition, but with a variation in temperature or voltage, the on-resistance of transistor T801 may vary enough to allow the fuse F801 to be evaluated as intact and vice-versa. Furthermore, when a fuse F801 is partially broken, the resistance may change over time allowing inconsistent evaluations.

Semiconductor devices must be screened during the manufacturing stage to ensure that only passing units are sold to the customer. However, if there are fuse evaluations that indicate a passing condition during testing only to fail at a later time, then the screening process has been inadequate. Thus, it is necessary to properly evaluate partially broken fuses that may pass under some conditions but can create failures in the future. Using conventional evaluation circuit 800, such semiconductor devices are not properly screened.

One approach to addressing the screening of partially broken fuses is disclosed in Japanese Laid-Open Patent Publication No. 10-62477. This approach will now be explained with reference to FIG. 9.

Figure 9:
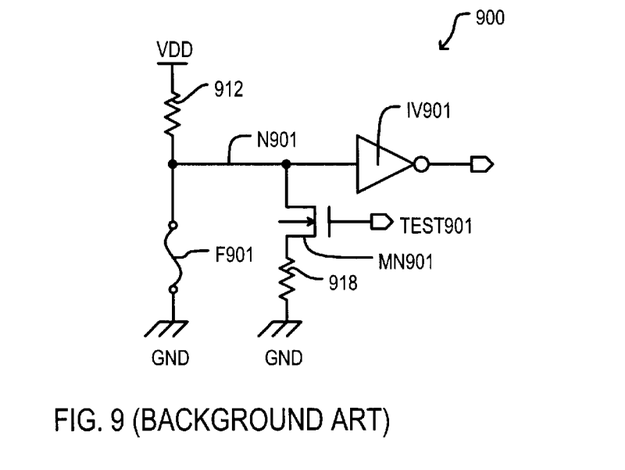
FIG. 9 is a circuit schematic diagram of a conventional fuse evaluation circuit.

Referring now to FIG. 9, a conventional fuse evaluation circuit is set forth in a circuit schematic diagram and given the general reference character 900.

Conventional fuse evaluation circuit 900 has a resistor 912 connected between a power supply VDD and a connection node N901 and a fuse F901 connected between connection node N901 and ground. An inverter IV910 is connected to receive connecting point N901 as an input. Conventional fuse evaluation circuit 900 also has an n-channel transistor having a drain connected to connection node N901, a source connected to a resistor 918 and a gate connected to a test mode signal TEST901. Resistor 918 is connected between ground and the source of n-channel transistor MN901.

In a normal operation of conventional fuse evaluation circuit 900, test mode signal TEST901 is at a logic low, thus n-channel transistor MN901 is turned off. In this mode, the status of the fuse is determined by the ratio of the resistance of fuse F901 and resistor 912. However, in the fuse evaluation test mode, test mode signal TEST901 is at a logic high. N-channel transistor MN901 is turned on. This lowers the potential of connecting point N901. In this manner, fuse F901 can be determined to be intact even if it is partially broken. Such a determination would cause the device to fail and become rejected.

However, in the conventional fuse evaluation circuit 900, resistors 912 and 918 require relatively large resistance values. This can cause the size of the conventional fuse evaluation circuit 900 to become large, particularly if resistors 912 and 918 are formed from a metal layer. If resistors 912 and 918 are formed from a layer such as polysilicon, they can become prone to process variations in manufacturing. Also, because of the relatively large resistance values, connecting point N901 does not settle quickly to its quiescent condition when the fuse evaluation test mode is entered causing an increase in time necessary to properly evaluate the condition of fuse F901.

Also, because there are typically a large number of fuses requiring such a conventional fuse evaluation circuit 900 on a semiconductor memory device such as a dynamic random access memory (DRAM), and other memory devices, the chip area can become large. This increases manufacturing costs because fewer devices can be built on a single wafer.

Also, in order to assure that devices are screened so that they will properly operate under all specified conditions, a relatively high precision can be needed to properly calibrate elements (resistors 912, resistor 918, and n-channel transistor MN901) in conventional fuse evaluation circuit 900. It can be difficult to retain a high relative precision between these devices because they are manufactured in different processing steps.

In view of the above discussion, it would be desirable to provide a semiconductor device having a fuse evaluation circuit that can provide sufficient evaluation margins to properly screen unreliable fuse conditions. It would also be desirable to provide a fuse evaluation circuit that enables a fast fuse condition determination. It would also be desirable to provide a fuse evaluation circuit having a reduced size. It would also be desirable to provide a fuse evaluation circuit having a relatively high precision so that it can properly be determined if a partially broken condition exists.

SUMMARY OF THE INVENTION

According to the present embodiments, a semiconductor device having a fuse evaluation circuit is provided. The fuse evaluation circuit can include a reference voltage generation circuit, a fuse circuit and a fuse evaluation control circuit.

According to one aspect of the embodiments, the fuse circuit can include a fuse arranged in series with an evaluation transistor and providing an evaluation potential. The evaluation transistor may have a controllable impedance path.

According to another aspect of the embodiments, a fuse evaluation control circuit can vary the impedance of an evaluation transistor in accordance with different modes of operation.

According to another aspect of the embodiments, reference voltage generation circuit can provide a reference voltage for setting the impedance of evaluation transistor. Fuse evaluation control circuit can vary the impedance of evaluation transistor by varying the reference voltage in accordance with different fuse evaluation modes of operation.

According to another aspect of the embodiments, fuse evaluation control circuit can include a first evaluation control circuit for decreasing the reference voltage and a second evaluation control circuit for increasing the reference voltage.

According to another aspect of the embodiments, first evaluation control circuit can reduce an impedance path from the reference voltage to a low power supply.

According to another aspect of the embodiments, the first evaluation control circuit can include a transistor having a gate and drain coupled to the reference voltage and a source coupled to the drain of a second transistor. The second transistor can have a source coupled to a low power supply and a control gate coupled to receive an evaluation mode control signal.

According to another aspect of the embodiments, the first evaluation control circuit can include a plurality of impedance paths arranged in parallel. Each impedance path comprising a transistor having a gate and drain coupled to the reference voltage and a source coupled to the drain of a second transistor. The second transistor can have a source coupled to a low power supply and a control gate coupled to receive an evaluation mode control signal.

According to another aspect of the embodiments, second evaluation control circuit can reduce an impedance path from the reference voltage to a current source coupled to a high power supply.

According to another aspect of the embodiments, the second evaluation control circuit can include a transistor having a source coupled to a current source, a drain coupled to the reference voltage and a gate coupled to receive an evaluation mode control signal.

According to another aspect of the embodiments, the first evaluation control circuit an include a plurality of impedance paths arranged in parallel. Each impedance path comprising a transistor having a source coupled to a current source, a drain coupled to the reference voltage and a gate coupled to receive an evaluation mode control signal.

According to another aspect of the embodiments, a test margin can be set by selectively enabling controllable impedance paths arranged in parallel to provide the reference voltage.

According to another aspect of the embodiments, the evaluation transistor may be an n-channel IGFET.

According to another aspect of the embodiments, fuse circuit can include a latch circuit coupled to evaluation node. The latch circuit can provide a latched fuse determination signal having a logic level determined by the potential of the fuse evaluation node.

According to another aspect of the embodiments, a fuse evaluation circuit can be enabled during a fuse evaluation timing. A fuse evaluation control circuit can also be enabled during the fuse evaluation timing.

According to another aspect of the embodiments, a fuse evaluation circuit can have a first mode of operation evaluating a fuse in a first state or a second state in accordance with whether the fuse has a resistance greater than or less than a first value.

According to another aspect of the embodiments, the fuse evaluation circuit can have a second mode of operation evaluating the fuse in the first state or the second state in accordance with whether the fuse has a resistance greater or less than a second value. The second value can be greater than the first value.

According to another aspect of the embodiments, the fuse evaluation circuit can have a third mode of operation evaluating the fuse in the first state or the second state in accordance with whether the fuse has a resistance greater or less than a third value. The third value can be less than the first value.

DETAILED DESCRIPTION OF THE EMBODIMENTS

Various embodiments of the present invention will now be described in detail with reference to a number of drawings.

Figure 1:
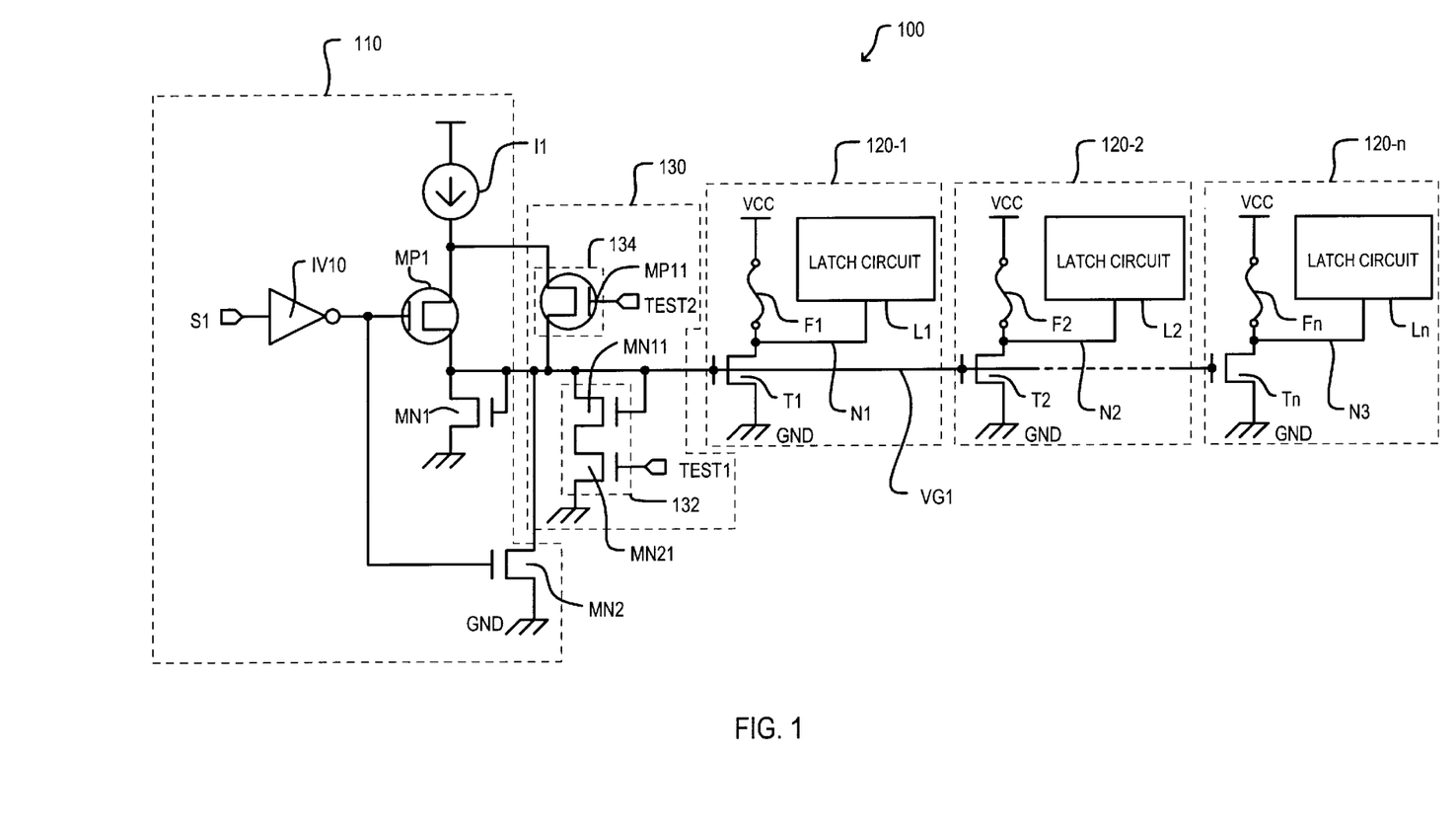
FIG. 1 is a circuit schematic diagram of a fuse evaluation circuit according to one embodiment.

Referring now to FIG. 1, a fuse evaluation circuit according to one embodiment is set forth in a circuit schematic diagram and given the general reference character 100.

Fuse evaluation circuit 100 can include a reference voltage generation circuit 110, fuse circuits (120-1 to 120-n) and a fuse evaluation control circuit 130.

Reference voltage generation circuit 110 can include a current source I1 coupled between a power supply VCC and a source of transistor MP1. Transistor MP1 may have a drain coupled to a reference voltage VG1 and a drain and gate terminal of transistor MN1. Reference voltage generation circuit 100 can also include a transistor MN2. Transistor MN2 may have a drain coupled to reference voltage VG1 and a source coupled to ground. Reference voltage generation circuit 100 can also include an inverter coupled to receive a fuse evaluation signal SI and produce an output to the control gates of transistors MP1 and MN2. Transistor MP1 may be a p-channel insulated gate field effect transistor (IGFET). Transistors MN1 and MN2 may be n-channel IGFETs. Current source I1 can be a constant current source, which may provide a relatively constant current over varying operating conditions.

Each fuse circuit (120-1 to 120-n) can include a fuse (F1 to Fn) coupled between a power supply VCC and an evaluation node (N1 to Nn). Each fuse circuit (120-1 to 120-n) can also include an evaluation transistor (T1 to Tn) having a source drain path coupled between evaluation node (N1 to Nn) and ground. Evaluation transistors (T1 to Tn) can be n-channel IGFETs. Evaluation node (N1 to Nn) may be coupled to a latch circuit (L1 to Ln). The resistance of each fuse (F1 to Fn), when intact, can be several kΩ. The on-resistance of each evaluation transistor (T1 to Tn) can be several tens kΩ or at least an order of magnitude greater than the resistance of an intact fuse (F1 to Fn).

Fuse evaluation control circuit 130 may include a first evaluation control circuit 132 and a second evaluation control circuit 134. First evaluation control circuit 132 can include a transistor MN11 having a drain and control gate coupled to reference voltage VG1. First evaluation control circuit 132 can also include a transistor MN21 having a drain coupled to a source of transistor MN11, a source coupled to ground and a control gate coupled to receive a first evaluation test signal TEST1. Transistors MN11 and MN21 may be n-channel IGFETs. Second evaluation control circuit 134 may be coupled between current source I1 and reference voltage VG1. Second evaluation control circuit 134 can include transistor MP11 having a source coupled to current source I1, a drain coupled to reference voltage VG1 and a control gate coupled to receive a second evaluation test signal TEST2. Transistor MP11 can be a p-channel IGFET.

Figure 2:
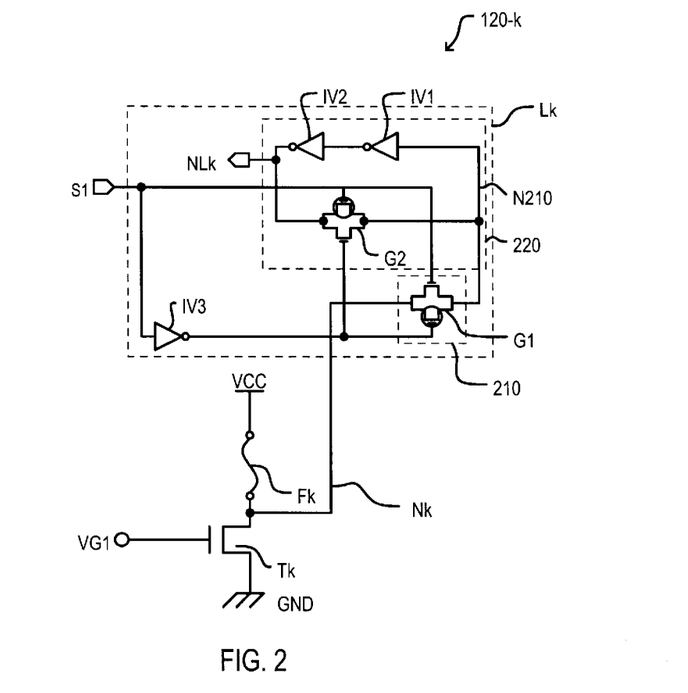
FIG. 2 is a circuit schematic diagram of a fuse circuit according to one embodiment.

Referring now to FIG. 2, a fuse circuit according to one embodiment is set forth in a circuit schematic diagram and given the general reference character 120-k. Fuse circuit 120-k can correspond to fuse circuits (120-1 to 120-n) in the fuse evaluation circuit 100 of FIG. 1.

Fuse circuit 120-k can include a fuse Fk, an evaluation transistor Tk, and a latch circuit Lk. Fuse circuit 120-k can receive fuse evaluation signal S1 as an input to latch circuit Lk and a reference voltage VG1 as an input at a control gate of evaluation transistor Tk and may produce a latched fuse evaluation signal NLk.

Fuse Fk can be coupled between power supply VCC and evaluation node Nk. Evaluation transistor Tk, can have a source drain path coupled between evaluation node Nk and ground and a control gate coupled to receive reference voltage VG1.

Latch circuit Lk can include an inverter IV3, a load circuit 210, and a flip-flop 220. Load circuit 210 can include a pass gate G1. Inverter IV3 can receive fuse evaluation signal S1 as an input. Load circuit 210 can be coupled between evaluation node Nk and node 210. Pass gate G1 can have complementary IGFETs arranged in parallel. Flip-flop 220 can include inverters (IV1 and IV2) and a pass gate G2. Inverters (IV1 and IV2) may have a trip point of approximately VCC/2. Inverter IV1 can have an input coupled to node N210 and an output coupled to an input of inverter IV2. Inverter IV2 can produce latched fuse evaluation signal NLk. A pass gate G2 can be coupled between latched fuse evaluation signal NLk and node N210. Pass gate G2 can receive fuse evaluation signal S1 and the output of inverter IV3 as control inputs. Pass gate G2 can have complementary IGFETs arranged in parallel.

The operation of the embodiment illustrated in FIG. 1 having a latch circuit as illustrated in FIG. 2 will now be described with reference to FIGS. 1 and 2.

Referring now to FIG. 1, when no determination of the state of fuses (F1 to Fn) is taking place, fuse evaluation signal S1 may be logic low, first evaluation test signal TEST1 may be logic low, and second evaluation test signal TEST2 may be logic high. With first evaluation test signal TEST1 logic low, first evaluation control circuit 132 may be disabled and transistor MN21 may be in a non-conducting state. With second evaluation test signal TEST2 logic high, second evaluation control circuit 134 may be disabled and transistor MP11 may be in a non-conducting state. With fuse evaluation signal S1 at a logic low, inverter IV10 can produce a logic high output which may be applied to control gates of transistor MP1 and MN2. Transistor MP1 may be turned off and transistor MN2 may be turned on. With transistor MP1 and transistor MP11 turned off, no current may flow from current source I1 to reference voltage node VG1. With transistor MN2 turned on reference voltage VG1 may be pulled to ground. This can disable all evaluation transistors (T1 to Tn) and they may be in a non-conducting state. This can reduce standby current consumption in fuse evaluation circuit 100.

Referring now to FIG. 2, it can be seen that when evaluation signal S1 is at a logic low, a logic latching pass gate G2 may be enabled, while load circuit 210 may be disabled. Thus, latch Lk can have the previously determined state (if evaluated) of fuse Fk latched and may produce a latched fuse determination signal NLk accordingly.

Referring now to FIG. 1, when it is to be determined the state of fuses (F1 to Fn), fuse evaluation signal S1 may transition from logic low to logic high. With fuse evaluation signal S1 at a logic high, a logic low may be applied to a control gate of transistor MP1 and a control gate of transistor MN2. Transistor MP1 may be turned on and transistor MN2 may be turned off. This can allow current from current source I1 to be applied to reference voltage node VG1 and conduct through transistor MN1. In this manner reference voltage VG1 may be generated and evaluation transistors (T1 to Tn) may be conducting. Transistor MN1 may form a current mirror configuration with evaluation transistors (T1 to Tn). In this manner, the current flowing through a particular evaluation transistor (T1 to Tn) may be proportional to the current flowing through transistor MN1. When conducting in the normal fuse evaluation mode (S1=logic high, TEST1=logic low, and TEST2=logic high) evaluation transistors (T1 to Tn) may each provide a normal mode on-resistance.

With evaluation transistors (T1 to Tn) conducting, a potential may be generated at each particular evaluation node (N1 to Nn) based on whether or not the corresponding fuse (F1 to Fn) is intact or broken.

Referring now to FIG. 2, the potential at evaluation node Nk can be received by load circuit 210. Load circuit 210 can be enabled by the high logic value of evaluation signal S1 and the potential at evaluation node (N1 to Nn) can be applied to node N210. If the potential at evaluation node Nk is below the trip point of inverter IV1, then a low logic level may be applied through inverters (IV1 and IV2) to generate latched fuse evaluation signal NLk, which may be logic low. Thus, indicating a broken fuse (F1 to Fn). However, if the potential at evaluation node Nk is above the trip point of inverter IV1, then a high logic level may be applied through inverters (IV1 and IV2) to generate latched fuse evaluation signal NLk, which may be logic high. Thus, indicating an intact fuse (F1 to Fn). However, as discussed earlier, this may not properly indicate a fuse that is only partially broken. After the fuse evaluation is complete, fuse evaluation signal S1 may transission back to logic low and the evaluation results may be latched in latch circuits (L1 to Ln).

In order to properly screen a fuse or fuses that are only partially broken the embodiment in FIG. 1 can include a first evaluation test mode (TEST1 is logic high), which can allow a partially broken fuse to be evaluated as an intact fuse. Also, the embodiment of FIG. 1 can include a second evaluation test mode (TEST2 is logic low), which can allow a partially broken fuse to be evaluated as a broken fuse. These modes of operation will now be described.

In order to properly determine that a particular fuse (F1 to Fn) may be partially broken, first evaluation test mode and second evaluation test mode can be performed in succession. If inconsistent results are obtained, then the particular fuse (F1 to Fn) may be deemed partially broken and the device may be rejected.

First, first evaluation test mode may be entered. In first evaluation test mode, first evaluation test mode signal TEST1 may transition to logic high while evaluation signal S1 may be logic high. With first evaluation test mode signal TEST1 logic high, first evaluation control circuit 132 may be enabled. With first evaluation test mode signal TEST1 logic high, transistor MN21 can be turned on. In this manner, a current path may be provided from reference voltage VG1 to ground through first evaluation control circuit 132. Conceptually, it can be seen that the current path from reference voltage VG1 to ground through first evaluation control circuit 132 can be provided in parallel with the current path to ground through transistor MN1. This may have the affect of reducing the effective resistance from reference voltage VG1 to ground. This can lower the potential of reference voltage VG1. With a lower reference voltage VG1 potential, evaluation transistors (T1 to Tn) can become more resistive. Fuse evaluation circuit 100 may be designed so that the on-resistance of each individual evaluation transistor (T1 to Tn) may be approximately twice as high in the first evaluation test mode as in the normal fuse evaluation mode. The increased on-resistance of evaluation transistors (T1 to Tn) can allow a partially broken fuse (F1 to Fn) to increase the potential at evaluation node (N1 to Nn) and may allow the latched fuse determination signal NLk (see FIG. 2) to be driven to a high logic level, thus indicating an intact fuse.

After first evaluation test is complete, evaluation signal S1 may return to logic low and first evaluation test signal TEST1 may return to logic low. First evaluation results may be latched in latch circuits (L1 to Ln).

Next, second evaluation test mode may be entered. In second evaluation test mode, second evaluation test mode signal TEST2 may transition to logic low while evaluation signal S1 may be logic high. With second evaluation test mode signal TEST2 logic low, second evaluation control circuit 134 may be enabled. With second evaluation test mode signal TEST2 logic low, transistor MP11 can be turned on. In this manner, a current path may be provided from current source I1 to reference voltage VG1 through second evaluation control circuit 134. Conceptually, it can be seen that the current path from current source I1 to reference voltage VG1 through second evaluation control circuit 134 can be provided in parallel with the current path from current source I1 to reference voltage VG1 through transistor MP1. This may have the affect of reducing the effective resistance from current source I1 to reference voltage VG1. This can raise the potential of reference voltage VG1. With a higher reference voltage VG1 potential, evaluation transistors (T1 to Tn) can become less resistive. Fuse evaluation circuit 100 may be designed so that the on-resistance of each individual evaluation transistor (T1 to Tn) may be approximately one-half as high in the second evaluation test mode as in the normal fuse evaluation mode. The decreased on-resistance of evaluation transistors (T1 to Tn) can allow a decreased potential at evaluation node (N1 to Nn) when there is a partially broken fuse (F1 to Fn). This can allow latched fuse evaluation signal NLk (see FIG. 2) to be driven to a low logic level, thus indicating a broken fuse.

After second evaluation test is complete, evaluation signal S1 may return to logic low and second evaluation test signal TEST2 may return to logic high. Second evaluation results may be latched in latch circuits (L1 to Ln).

In this manner, when a fuse (F1 to Fn) can be determined to be intact under a first evaluation test and can be determined to be broken under a second evaluation test, the particular fuse (F1 to Fn) can be evaluated as partially broken and the device may be rejected.

Figure 3:
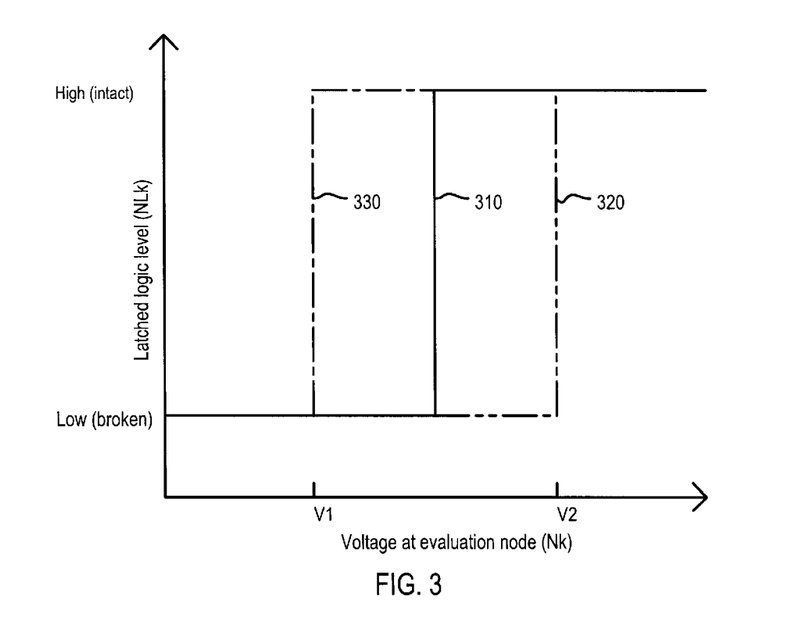
FIG. 3 is a graph illustrating fuse evaluations according to an embodiment.

Referring now to FIG. 3, a graph illustrating fuse evaluations in the embodiment of FIG. 1 is set forth.

Fuse evaluation graph of FIG. 3 includes waveform 310 which illustrates how potential at evaluation node (N1 to Nn) can give either an evaluation of "broken" or "intact" based on a trip point in the latch circuit (L1 to Ln). Waveform 320 illustrates how a fuse, which may produce a potential at evaluation node (N1 to Nn) in a normal operation, can be evaluated in the first evaluation test. Waveform 330 illustrates how a fuse, which may produce a potential at evaluation node (N1 to Nn) in a normal operation, can be evaluated in the second evaluation test. It can be seen that a partially broken fuse that may produce a potential at evaluation node (N1 to Nn) in a normal operation that falls between V1 and V2 can produce inconsistent evaluations when evaluated under the first evaluation test and the second evaluation test. A device having such a partially broken fuse can be rejected. In this manner, fuse evaluation circuit 100 may have a test mode that provides sufficient margin to screen a partially broken fuse that may be incorrectly evaluated under operating conditions that may fall within specified values. It may be noted that an actual intact fuse may produce a potential at evaluation node that is greater than V2 under all operating conditions. Also, a completely broken fuse may produce a potential at evaluation node that is less than V1.

A device containing a partially broken fuse having a resistance slightly lower than the on-resistance of its corresponding evaluation transistor may be rejected using only a first evaluation test. However, it may not be determined whether the fuse breakage has been defective, a redundant memory cell is defective, or if a decoder selecting a redundant memory cell is defective. However, the second evaluation test may be used to properly identify the partially broken fuse as defective by latching inconsistent evaluation results in a particular latch circuit.

Based on results of first and second evaluations, logic levels of latched fuse evaluation signal NLk are illustrated in the following table.

|  | Broken fuse | Intact fuse | Partially broken fuse |
|---|---|---|---|
| First evaluation test mode | Low | High | High |
| Second evaluation test mode | Low | High | Low |

Sometimes, due to processing variations, a fuse may become highly resistive even though no attempts at blowing the fuse have been made. Such a case will now be illustrated.

Figure 6A:
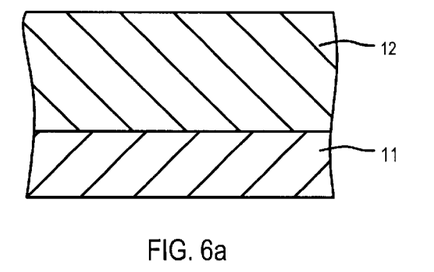
FIGS. 6a–c are cross-sectional views illustrating a normal fuse etching process and a fuse that has been over-etched.
Figure 6B:
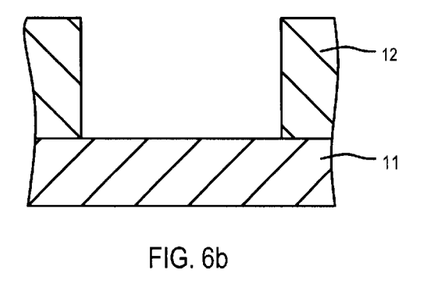
Figure 6C:
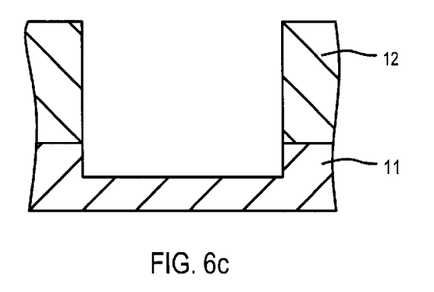

Referring now to FIGS. 6a–c, cross-sectional views showing a normal fuse etching process and a fuse that has been over-etched is set forth. FIG. 6a may include a metal layer 11 which may form a fuse and a protective film 12. Protective film 12 may be used as an insulation film to separate different layers on the semiconductor.

Referring now to FIG. 6b, protective film 12 may be etched to expose metal layer 11. This may be done so that the fuse formed by metal layer 11 may be broken to replace defective elements if they exist on the semiconductor device. FIG. 6b may illustrate a desired etching result.

An over-etched condition may be illustrated with reference to FIG. 6c. If protective film 12 is excessively etched, metal layer 11 may become thin. This may increase the resistance of an intact fuse. If the resistance increase is excessive enough that the device may fail under operating conditions, the fuse evaluation procedure discussed may be used to effectively screen such a device, so that the device may be discarded.

Similarly, a partial breakage may occur due to a malfunction of a laser trimming machine. Partial breakages may also occur due to an error in programming the fuse coordinates in the laser trimming machine. Such partial breakages may be detected using the disclosed embodiments.

In some cases, the resistance of a fuse may become slightly lower than the on-resistance of an evaluation transistor during normal operation. Such a case may be detected in the second evaluation test mode and the device may be rejected as defective.

If a conventional fuse evaluation circuit 900 such as is illustrated in FIG. 9 is applied to a semiconductor device such as a memory in which a large number of fuse elements may be needed, an extremely high resistance of resistive element 912 and fuse F901 may be required in order to limit standby current. For example, if the power supply voltage is 3V, the specification value of the standby current is 100 μA, and the number of fuses is 1,000, then the resistive element 912 may require a resistance of at least 30×10⁶ Ω. This result may be obtained from the following equation.

$$R=(V/I)=(3/(100\times10^{-6}/1000))=30\times10^{6}\Omega$$

Other internal circuits may consume current or have normal leakage current, thus requiring an even higher resistance value for resistive element 912. Because resistive layers today may typically be formed using a metal layer, a large area can be required to achieve the desired resistance. However, by using the embodiment disclosed in FIG. 1, no resistive element may be required, thus adverse effects on chip size may be eliminated.

In order to test a fuse in conventional fuse evaluation circuit of FIG. 9, n-channel transistor MN901 and resistor 918 is connected to node N901 to which fuse F901 is connected. Therefore, if the test is applied to a semiconductor device having a plurality of fuses a plurality of conventional fuse evaluation circuits 900 would be necessary. Thus the same number of n-channel transistors MN901 and resistors 918 as fuses would be required. Additionally, if operating margins required a similar test structure connected to power supply VDD, then the transistor and resistor count could double.

On the other hand, the embodiment of FIG. 1 may only require voltage generation circuit 110 and fuse evaluation control circuit 130 for increasing and decreasing reference voltage VG1. It is noted that evaluation control circuit 130 may only have three transistors. Only a single evaluation transistor (T1 to Tn) may be needed for each fuse (F1 to Fn). Therefore, the embodiment of FIG. 1 may be suitable to prevent significant increases in chip size.

In the conventional fuse evaluation circuit 900 of FIG. 9, resistor 912 has a fixed value. Because the on-resistance of n-channel transistor MN901 is small compared to resistor 912, when the threshold voltage of n-channel transistor MN901 rises due to process variations, there is little effect on the potential of node N901. On the other hand, in this case the threshold voltage of inverter IV901 may vary causing the evaluation of the condition of fuse F901 to vary.

However, in the embodiment of FIG. 1, if the threshold voltage of, for example transistors (MN1 and MN11) rise, the reference voltage VG1 may also increase. This can increase the control gate voltage of evaluation transistors (T1 to Tn) and may serve to compensate for any resistance increases in evaluation transistors (T1 to Tn).

Figure 4:
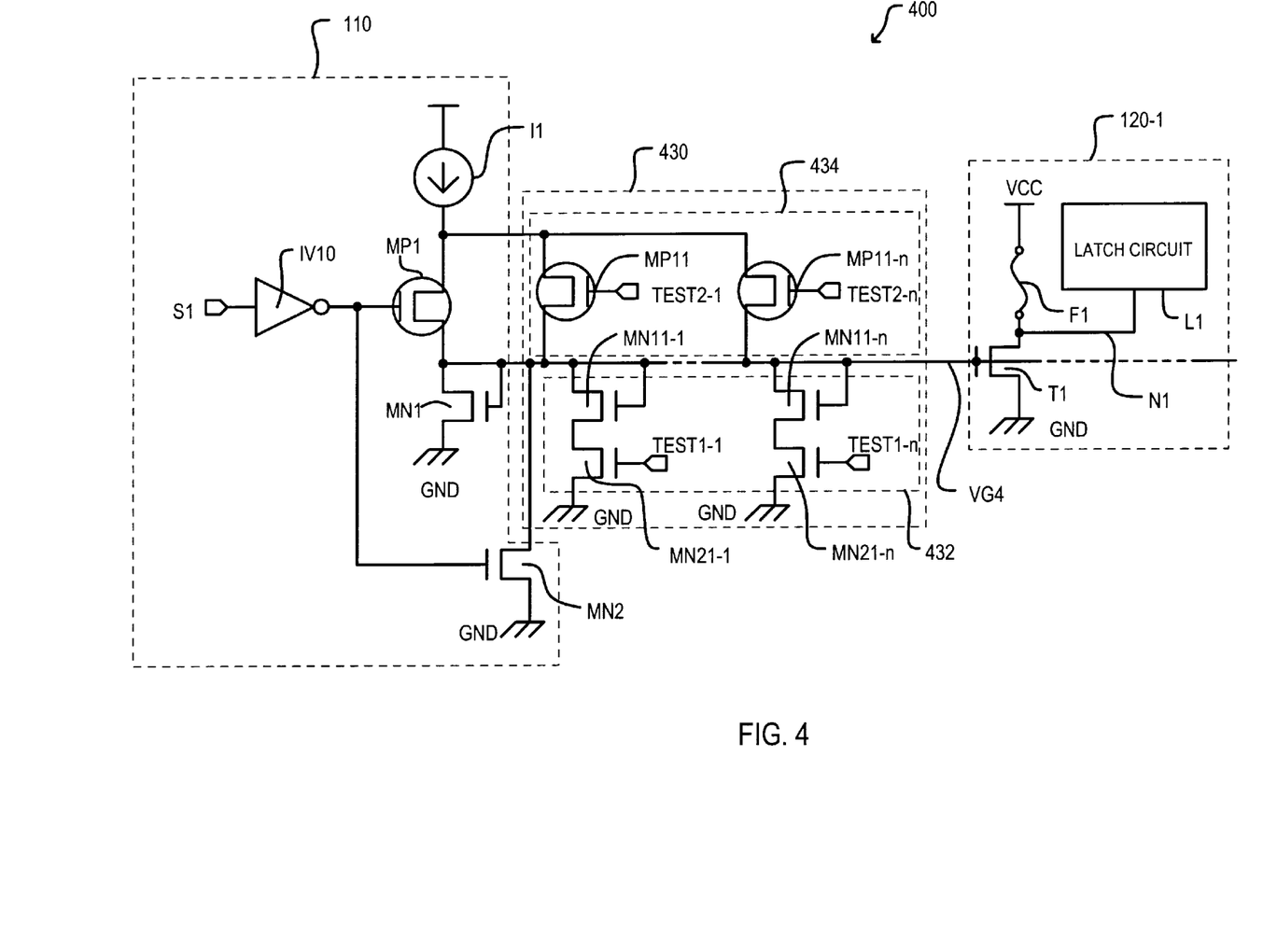
FIG. 4 is a circuit schematic diagram of a fuse evaluation circuit according to one embodiment.

Another embodiment will now be described with reference to FIG. 4. Referring now to FIG. 4, a fuse evaluation circuit according to one embodiment is set forth in a circuit schematic diagram and given the general reference character 400. Fuse evaluation circuit 400 may include similar elements as fuse evaluation circuit 100 in FIG. 1, and such elements may have the same reference character and a detailed description may be omitted.

Fuse evaluation circuit 400 may include a fuse evaluation control circuit 430. Fuse evaluation control circuit may include a first evaluation control circuit 432 and a second evaluation control circuit 434.

First evaluation control circuit 432 can include a transistors (MN11-1 to MN11-n) having a drain and control gate coupled to reference voltage VG1. First evaluation control circuit 432 can also include transistors (MN21-1 to MN21-n), each having a drain coupled to a source of a transistor (MN11-1 to MN11-n) respectively, a source coupled to ground and a control gate coupled to receive a first evaluation test signal (TEST1-1 to TEST1-n) respectively. Transistors (MN11-1 to MN11-n) and transistors (MN21-1 to MN21-n) may be n-channel IGFETs.

Second evaluation control circuit 434 may be coupled between current source I1 and reference voltage VG1. Second evaluation control circuit 434 can include transistors (MP11-1 to MP11-n), each having a source coupled to current source I1, a drain coupled to reference voltage VG1 and a control gate coupled to receive a second evaluation test signal (TEST2-1 to TEST2-n), respectively. Transistors (MP11-1 to MP11-n) can be p-channel IGFETs.

Any combination of first evaluation test signals (TEST1-1 to TEST1-n) may become logic high in a first evaluation test mode. Any combination of second evaluation test signals (TEST2-1 to TEST2-n) may become logic low in a second evaluation test mode.

The sizes and therefore the current sourcing or sinking capabilities of transistors (MN11-1 to MN11-n) and transistors (MN21-1 to MN21-n) may be equal to or different from each other. Similarly, sizes and therefore the current sourcing or sinking capabilities of transistors (MP11-1 to MP11-n) may be equal to or different from each other.

In fuse evaluation circuit 400, when operating in the first evaluation test mode, one or more of first evaluation test signals (TEST1-1 to TEST1-n) may transition to logic high. In this manner, for each first evaluation test signal (TEST1-1 to TEST1-n) that may be at logic high, a parallel current path to ground from reference voltage VG4 can be created. This can serve to lower the potential of reference voltage VG4. The amount in which the potential of reference voltage VG4 may be lowered can be adjusted by providing either more or fewer first evaluation test signals (TEST1-1 to TEST1-n) at logic high.

Similarly, in fuse evaluation circuit 400 when operating in the second evaluation test mode, one or more of second evaluation test signals (TEST2-1 to TEST2-n) may transition to logic low. In this manner, for each second evaluation test signal (TEST2-1 to TEST2-n) that may be at logic low, a parallel current path from current source I1 to reference voltage VG4 can be created. This can serve to raise the potential of reference voltage VG4. The amount in which the potential of reference voltage VG4 may be raised can be adjusted by providing either more or fewer second evaluation test signals (TEST2-1 to TEST2-n) at logic low.

Thus, in both first and second evaluation test modes, the on-resistance of evaluation transistors (T1 to Tn) may be adjusted. In this manner, referring to FIG. 3, hypothetical potential levels (V1 to V2) of evaluation node (N1 to Nn) as in a normal operation may create a range in which a device can be rejected due to at least one partially broken fuse. The potential levels (V1 to V2) may be finely adjusted by varying the combination of first evaluation test signals (TEST1-1 to TEST1-n) and/or second evaluation test signals (TEST2-1 to TEST2-n) that may become active during first and second evaluation test modes.

Figure 5:
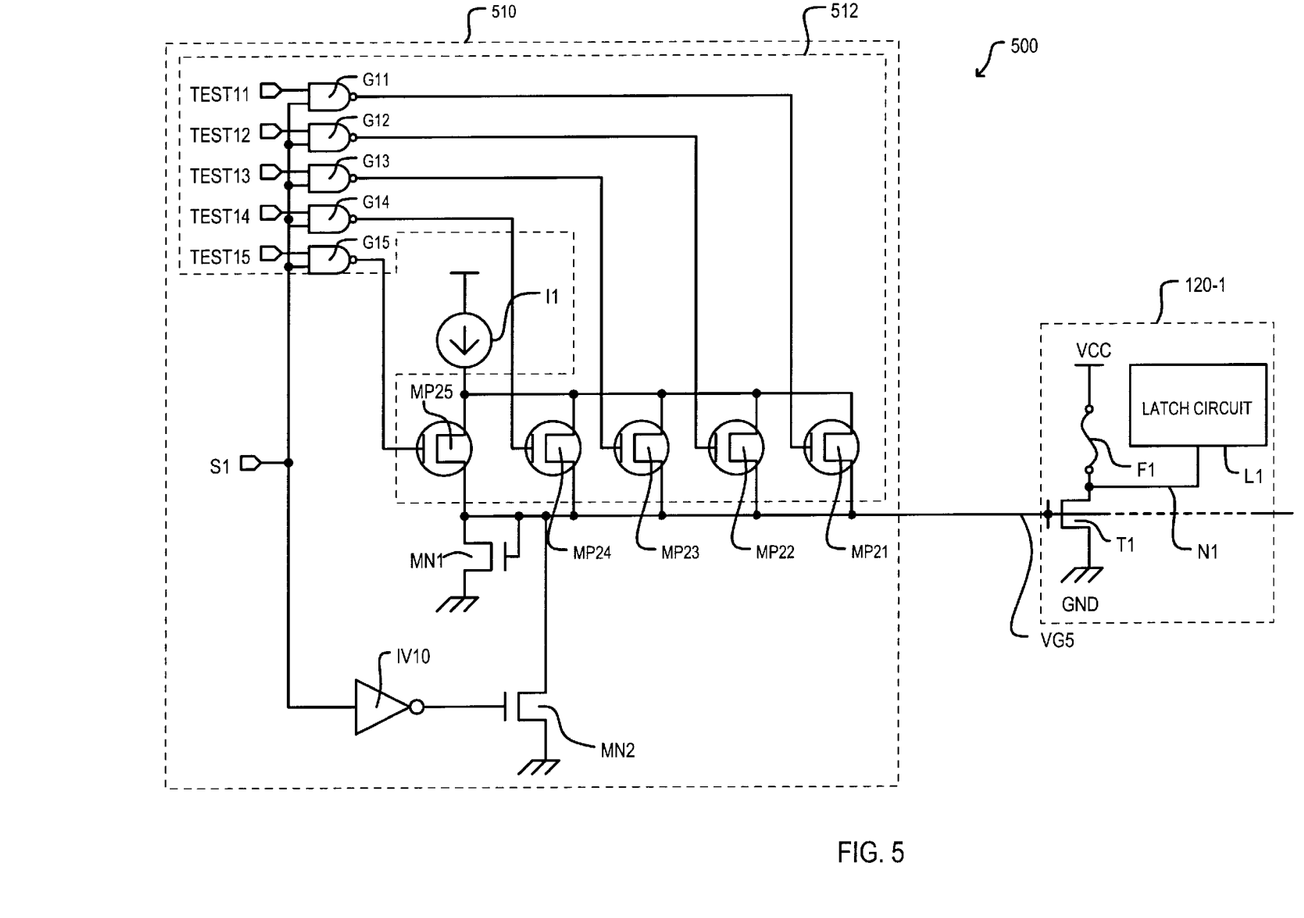
FIG. 5 is a circuit schematic diagram of a fuse evaluation circuit according to one embodiment.

Yet another embodiment will now be described with reference to FIG. 5. Referring now to FIG. 5, a fuse evaluation circuit according to one embodiment is set forth in a circuit schematic diagram and given the general reference character 500. Fuse evaluation circuit 500 may include similar elements as fuse evaluation circuit 100 in FIG. 1, and such elements may have the same reference character and a detailed description may be omitted.

Fuse evaluation circuit 500 may include a reference voltage generation circuit 510. Reference voltage generation circuit 510 may include a reference voltage adjusting circuit 512. Reference voltage adjusting circuit 512 may include enable gates (G11 to G15) and adjustment transistors (MP21 to MP25). Each enable gate (G11 to G15) can be coupled to receive a reference adjust signal (TEST11 to TEST15), respectively and fuse evaluation signal S1 as inputs. Each enable gate (G11 to G15) may produce a control signal for controlling an impedance path of a corresponding adjustment transistor (MP21 to MP25). Each adjustment transistor (MP21 to MP25) may have a source coupled to current source I1, a drain coupled to reference voltage VG5 and a gate coupled to receive a respective control signal, which may be generated by an enable gate (G11 to G15).

Reference voltage adjusting circuit 512 may be used to program the reference voltage VG5 during a fuse evaluation operation in accordance with the logic values of reference adjust signals (TEST11 to TEST15). For example, reference adjust signals (TEST11 to TEST15) may be set so that reference adjust signals (TEST11 to TEST13) may be logic high and reference adjust signals (TEST14 and TEST15) may be a logic low by default, as just one example. In this manner, when fuse evaluation signal S1 transitions to a logic high, enable gates (G11 to G13) may provide logic low control signals to adjustment transistors (MP21 to MP23) and enable gates (G14 and G15) may provide logic high control signals to adjustment transistors (MP24 and MP25). Under this condition, adjustment transistors (MP21 to MP23) may be turned on and adjustment transistors (MP24 and MP25) may be turned off. In accordance, reference voltage VG5 may be generated.

However, if due to a change in process variations, a device has been manufactured that may have a fuse or fuses having a lower resistance than may be typical and/or evaluation transistors (T1 to Tn) may be weak, evaluation node (N1 to Nn) may have a higher potential than is typical. In this case, erroneous fuse evaluations may occur and/or the evaluation time may be increased.

In such a case as mentioned above, reference adjust signals (TEST14 and TEST15) may also become logic high, as just one example. This may turn on adjustment transistors (MP21 to MP25) during the fuse evaluation mode and can raise the potential of reference voltage VG5. The raised potential of reference voltage VG5 may reduce the on resistance of evaluation transistors (T1 to Tn). This may compensate the affects of the process variations on the fuse evaluation.

However, if due to a change in process variations, a device has been manufactured that may have a fuse or fuses having a higher resistance than may be typical and/or evaluation transistors (T1 to Tn) may be strong, evaluation node (N1 to Nn) may have a lower potential than is typical. In this case, erroneous fuse evaluations may occur and/or the evaluation time may be increased.

In such a case as mentioned above, reference adjust signals (TEST12 to TEST15) may become logic low and only reference adjust signal TEST11 may be a logic high, as just one example. This may only turn on adjustment transistor MP21 during the fuse evaluation mode and can lower the potential of reference voltage VG5. The lower potential of reference voltage VG5 may increase the on resistance of evaluation transistors (T1 to Tn). This may compensate the affects of the process variations on the fuse evaluation.

In addition, the combination of logic levels of reference adjust signals (TEST11 to TEST15) may be set which may reduce unnecessary current consumption in latch circuit (L1 to L5), as just one example.

After a completion of the fuse evaluation during testing of a device, reference adjust signals (TEST11 to TEST15) may be set by fuse options, bonding options or mask modification, as just a few examples.

According to fuse evaluation circuit 500, as described above, variation in process parameters that change the drive strength of transistors or resistance of a fuse may be compensated for so as to have a reduced affect on a fuse evaluation operation. This may be accomplished by selecting a suitable reference voltage VG5 by properly setting logic levels of reference adjust signals (TEST11 to TEST15) during an initial evaluation.

It is understood that finer tuning of reference voltage VG5 may be made by increasing the number of reference adjust signals, enable gates and adjustment transistors. In addition, evaluations performed using fuse evaluation circuit 500 may also be performed by using fuse evaluation circuit 100 and fuse evaluation circuit 400.

In the embodiments as described, because the on-resistance of an evaluation transistor may stabilize in a short time, the potential of a fuse evaluation node may reach its true evaluation potential in a short time. This can allow a quick evaluation as to whether a particular fuse is properly broken or not. Additionally, because the embodiments as described may not have intended resistors, which may have larger process variations, used in the fuse evaluation circuit, fuse evaluations may be achieved in a higher precision.

It is understood that the embodiments described above are exemplary and the present invention should not, be limited to those embodiments. Specific structures should not be limited to the described embodiments.

For example, it is understood that fuse evaluation signal S1 may be a power-up signal. Such a fuse evaluation signal S1 may be generated by detecting a power supply voltage reaching a sufficient potential. It is understood that the fuse evaluation may occur every time a device is powered-up.

Although semiconductor memory was discussed, it is understood that the embodiments are applicable to any device that implements a fuse that may be broken or left intact. Such fuse structures may include electrically programmable transistors used as a programmable fuse, as just one example. It is understood that the embodiments are applicable to fuse structures that may be broken with a laser pulse, an applied voltage or current, as just a few examples.

In the embodiments the evaluation results may be output onto a bond or probe pad on the semiconductor device. Evaluation results may then be read by a testing apparatus, which may screen the device based on the results.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device having a fuse evaluation circuit, the fuse evaluation circuit comprising:
   at least one programmable fuse arranged in series with a controllable impedance path; and
   a control circuit varying the impedance of the controllable impedance path.

2. A semiconductor device according to claim 1, wherein the control circuit varies the impedance of the controllable impedance path by varying a control node potential.

3. The semiconductor device according to claim 2, wherein a voltage generator produces a first node control node potential in a first mode and the control circuit produces a second control node potential in a second mode.

4. The semiconductor device according to claim 3, wherein the second control node potential is greater than the first control node potential.

5. The semiconductor device according to claim 3, wherein the second control node potential is less than the first control node potential.

6. The semiconductor device according to claim 3, the control circuit produces a third control node potential in a third mode and the first control node potential is between the second control node potential and the third control node potential.

7. A semiconductor device having a fuse evaluation circuit for determining whether a fuse is in a first state or a second state, comprising:

an evaluation node coupled to the fuse;

an evaluation transistor coupled to the evaluation node, the evaluation transistor having a controllable impedance path; and a control circuit coupled to a control gate of the evaluation transistor to adjust the impedance of the controllable impedance path.

8. The semiconductor device according to claim 7, further including:

a latch circuit coupled to the evaluation node, the latch circuit provides a latched fuse evaluation signal based on the potential of the evaluation node.

9. The semiconductor device according to claim 7, further including:

a voltage generation circuit applying a reference voltage to the control gate of the evaluation transistor; and the control circuit includes a first evaluation control circuit for decreasing the reference voltage and a second evaluation control circuit for increasing the reference voltage.

10. The semiconductor device according to claim 9, wherein the voltage generation circuit is coupled to receive a fuse evaluation enable signal that enables the generation of the reference voltage when the state of the fuse is to be evaluated.

11. The semiconductor device according to claim 9, wherein the first evaluation control circuit is not enabled at the same time as the second evaluation control circuit.

12. The semiconductor device according to claim 9, wherein the first evaluation control circuit includes a first control evaluation impedance path coupled between the control gate of the evaluation transistor and a low power supply voltage and the first first control evaluation impedance path is enabled by a first evaluation control signal.

13. The semiconductor device according to claim 12, wherein the first evaluation control circuit includes second control evaluation impedance path coupled between the control gate of the evaluation transistor and a low power supply voltage and the second control evaluation impedance path is enabled by a second evaluation control signal.

14. The semiconductor device according to claim 9, wherein the second evaluation control circuit includes a third control evaluation impedance path coupled between the control gate of the evaluation transistor and a high power supply and the third control evaluation impedance path is enabled by a third evaluation control signal.

15. The semiconductor device according to claim 14, wherein the second evaluation control circuit includes a fourth control evaluation impedance path coupled between the control gate of the evaluation transistor and a low power supply voltage and the fourth control evaluation impedance path is enabled by a fourth evaluation control signal.

16. A semiconductor device having a fuse evaluation circuit, the fuse evaluation circuit comprising:

a fuse circuit including a fuse coupled in series with an evaluation device to produce a evaluation potential at an evaluation node;

a voltage generator for providing a control potential to control the impedance of the evaluation device during a first fuse evaluation mode; and a fuse evaluation control circuit for changing the control potential during a second fuse evaluation mode.

17. The fuse evaluation circuit according to claim 16, wherein the fuse evaluation control circuit includes a plurality of controllable impedance paths arranged in parallel, each controllable impedance path coupled to receive a controllable impedance path enable signal and providing a low impedance path when the controllable impedance path enable signal is in a first logic state and providing a high impedance path when the controllable impedance path enable signal is in a second logic state and the control potential is determined by the logic states of the controllable impedance path enable signals.

18. The fuse evaluation circuit according to claim 17, wherein the voltage regulator receives a fuse evaluate signal and each controllable impedance path is coupled to receive a logical combination of the fuse evaluation signal the corresponding controllable impedance path enable signal.

19. The fuse evaluation circuit according to claim 16, further including a latch circuit coupled to the evaluation node to latch a fuse state according to the evaluation potential.

20. The fuse evaluation circuit according to claim 19, wherein the fuse evaluation circuit provides a first test mode and a second test mode and the control potential is lower in the first test mode than in the second test mode.

* * * * *